United States Patent
Nesbitt et al.

[19]

[11] Patent Number: 6,137,706
[45] Date of Patent: Oct. 24, 2000

[54] DUAL-INPUT, AUTOMATIC-SWITCHING POWER SUPPLY

[75] Inventors: Curt G. Nesbitt, Sioux Falls; Joseph B. Skorjanec, Garretson; Michael B. Pulizzi, Hartford, all of S. Dak.

[73] Assignee: Pulizzi Engineering Inc, Santa Ana, Calif.

[21] Appl. No.: 09/507,451

[22] Filed: Feb. 19, 2000

[51] Int. Cl.⁷ ........................................... H02M 1/10
[52] U.S. Cl. .......................................................... 363/142
[58] Field of Search ........................... 363/50, 142, 143; 361/191; 307/43, 64, 66

[56] References Cited

U.S. PATENT DOCUMENTS

| | | | |
|---|---|---|---|
| 3,707,669 | 12/1972 | Kanngiesser et al. | 363/51 |
| 4,402,028 | 8/1983 | Udren | 367/36 |
| 4,763,013 | 8/1988 | Gvoth, Jr. et al. | 307/66 |
| 5,138,547 | 8/1992 | Swoboda | 363/143 |
| 5,666,006 | 9/1997 | Townsley et al. | 307/66 |
| 5,790,391 | 8/1998 | Stich et al. | 363/24 |
| 6,055,145 | 4/2000 | Lagree et al. | 361/93.1 |

*Primary Examiner*—Adolf Daneke Berhane
*Attorney, Agent, or Firm*—Howard R. Lambert

[57] ABSTRACT

A dual-input, automatic-switching power supply comprises a primary power input, a secondary power input, and a power output. Included are first and second DPST mechanical relays and a third DPDT mechanical relay. A first relay input is connected to the primary power input and a corresponding first relay output is connected to a third relay input. A second relay input is connected to the secondary power input and a corresponding second relay output is connected to a different third relay input. The third relay output is connected to the power output. The relays in combination provide a relay moving contact gap spacing, source to source, of at least three millimeters. A first under voltage control module maintains the first and third relays in states causing the primary power input to be connected to the power output as long as voltage from the primary power input remains above a preestablished primary voltage dropout level. A second under voltage control module maintains the second relay in a state causing the secondary power input to be connected to the second input pin of the third relay as long as voltage from the secondary power input remains above a preestablished secondary voltage dropout level. A flip-flop is used to automatically switch the third relay to a state causing the primary power input to be disconnected from, and the secondary power input to be connected to the power output when the primary power input voltage drops below the primary voltage dropout level.

16 Claims, 3 Drawing Sheets

DUAL-INPUT, AUTOMATIC-SWITCHING POWER SUPPLY

BACKGROUND OF THE INVENTION

1. Field of the Invention

The present invention relates generally to electrical power supplies and more particularly to dual-input, or redundant, automatic-switching power supplies.

2. Background Discussion

Many critical or important electrical and/or electronic equipment or systems require an uninterrupted or substantially uninterrupted supply of electrical operating power at a constant, preestablished voltage level.

A few examples of such equipment or systems are main frame computer systems, hospital operating room and critical care equipment, air traffic control systems, police and fire emergency equipment, telecommunication systems, and national security systems. As may be imagined, the failure of a power supply to deliver a constant, preestablished voltage to such critical equipment or systems can have serious and often dangerous consequences.

It is, therefore, common to provide dual-source electrical power supplies or systems having a primary power (voltage) source input and a secondary power (voltage) source input for providing power (e.g., at 240 volts AC or 120 volts AC or any other voltage according to system requirements) to at least one associated electrical power output. This power output is normally internally connected to provide power from the primary power input.

Dual-input power supplies are, however, ordinarily configured for automatically switching the power output from the primary power input to the secondary power input when the voltage from the primary power input drops below a preestablished dropout level. Thus, the secondary power input provides a back-up for the primary power input.

Such dual-input, automatic-switching power supplies typically also provide for automatically switching the power output from the secondary power back to the primary power when the voltage from the primary power input subsequently rises to a pull-in level above the dropout level, as in the case of a temporary power "brown-out" having been corrected by the primary power source.

The external power source for connecting to the primary power input is normally selected as the most reliable, and usually the least expensive, power source, and may be the local electric power company (through a conventional building outlet). The external power source for connecting to the secondary power input may be an alternative power company (through an alternative building outlet) or an in-house electric generator. The two external power sources are ordinarily both connected to the associated primary and secondary power inputs so that power from one source or the other is always provided to the power supply output, failure of both external power sources being considered highly unlikely.

An important design consideration for any dual-input, auto-switching power supply is the time required for switching the power output from the primary power input to the secondary power input when the voltage from the primary power input drops to its dropout level. Also important is the time required for switching from the secondary power input back to the primary power input voltage after the primary voltage has risen back above the dropout voltage level to a pull-in level. Such switching back is important when, for example, the external power source connected to the primary power input is the local power company and the external power source connected to the secondary power input is provided by an electric generator.

It is generally accepted in the industry that the operation of electrical or electronic equipment of the type that would normally be connected for receiving power from the power output of a dual-input, auto-switching power supply will not be affected if the above-described switching times are no greater than about twenty milliseconds.

Another important design consideration relates to mechanical relays that are typically used to provide the above-described power input switching. In order to reduce the shock hazard on exposed metal pins of a second power input if only one external power source is connected, international standard "EN 60950" requires at least a three millimeter relay moving contact spacing gap, source to source.

However, achieving switching times no greater than twenty milliseconds has previously, to the knowledge of the present inventors, not been possible utilizing mechanical relays having at least a three millimeter moving contact gap spacing, source to source. Typically such relay moving contact gap spacing, source to source, has heretofore had to be less than about one millimeter in order to achieve the at least a twenty millisecond switching time. As an example, although very fast switching times can usually be obtained using solid-state relays, the EN60950 minimum clearance for insulation in primary circuits, and between primary and secondary circuits, is not achieved. Moreover, the failure mode of solid-state relays is not accurately predictable-such relays may fail with contacts open or contacts closed.

On the other hand, when relay moving contact spacing gaps, source to source, of at least three millimeters have been achieved, the twenty millisecond minimum switching times have not been obtained.

Another problem commonly observed on known dual-input, auto-switching power supplies is relay contact chattering at the power input switching points, for example, when the voltage from the primary power input gradually drops to its dropout level or rises back to its voltage pull-in level. Such relay chattering is caused by the relay coil triggering circuit reacting in an analog manner; that is, not in a precise, digital manner and can cause voltage irregularities at the power output with possible malfunction of electrical or electronic equipment receiving power from the output.

For these and other reasons, a principal objective of the present invention is to provide a dual-input, auto-switching power supply having a switching speed no greater than about twenty milliseconds while maintaining a relay moving contact spacing gap of at least about three millimeters, source to source. Another important objective of the present invention is to provide a dual-input, auto-switching power supply that eliminates relay chattering at the switching points.

SUMMARY OF THE INVENTION

In accordance with the present invention there is provided a dual-input, auto-switching power supply comprising a primary power input, a secondary power input, a power output and first, second and third mechanical relays.

An input pin of the first relay is electrically connected to the primary power input and a corresponding output pin of the first relay is electrically connected to a first input pin of the third relay. An input pin of the second relay is electrically connected to the secondary power input and a corresponding output pin of the second relay is electrically connected to a second input pin of the third relay. A common output of the third relay is electrically connected to the power output.

The arrangement of the three mechanical relays provide, in combination, at least a three millimeter relay moving contact gap, source to source.

There are further included first control means connected for maintaining the first and third relays in states causing the primary power input to be electrically connected to the power output as long as voltage from the primary power input remains above a preestablished primary voltage dropout level. Second control means are connected for maintaining the second relay in a state causing the secondary power input to be electrically connected to the second input pin of the third relay as long as voltage from the secondary power input remains above a preestablished secondary voltage dropout level.

Included are switching means operative for automatically switching the third relay to a state causing the primary power input to be electrically disconnected from the power output and causing the secondary power input to be electrically connected to the power output when voltage from the primary power input drops below the preestablished primary voltage dropout level, the switching time being no more than about 15 milliseconds.

Preferably, the switching means are then operative for switching the third relay to a state disconnecting the secondary power input from the power output and reconnecting the primary power input to the power output and when voltage from the primary power input rises to a preestablished primary voltage pull-in level that is about eight percent greater than the preestablished primary voltage dropout level, the time required for this switching back being less than about 15 milliseconds. Hysteresis means are preferably provided for establishing the primary voltage pull-in level.

Preferably, the first and second relays are normally open, double pole, single throw relays and the third relay is a double pole, double throw relay.

Precise relay state switching is provided by a flip-flop circuit connected for changing the operating state of the third relay.

The dual-input, auto-switching power supply system of the present invention thus provides very fast switching times between the two power inputs while maintaining a relay moving contact gap spacing, source to source, of at least 3 millimeters. In addition precise switching at preestablished voltage levels is assured to prevent relay

BRIEF DESCRIPTION OF THE DRAWINGS

The present invention can be more readily understood by a consideration of the following detailed description when taken in conjunction with the accompanying drawings, in which.

In the various FIGS., the same elements and features are given the same reference numbers except as may otherwise be disclosed in the following DESCRIPTION.

DESCRIPTION OF THE PREFERRED EMBODIMENT

Figure 1:
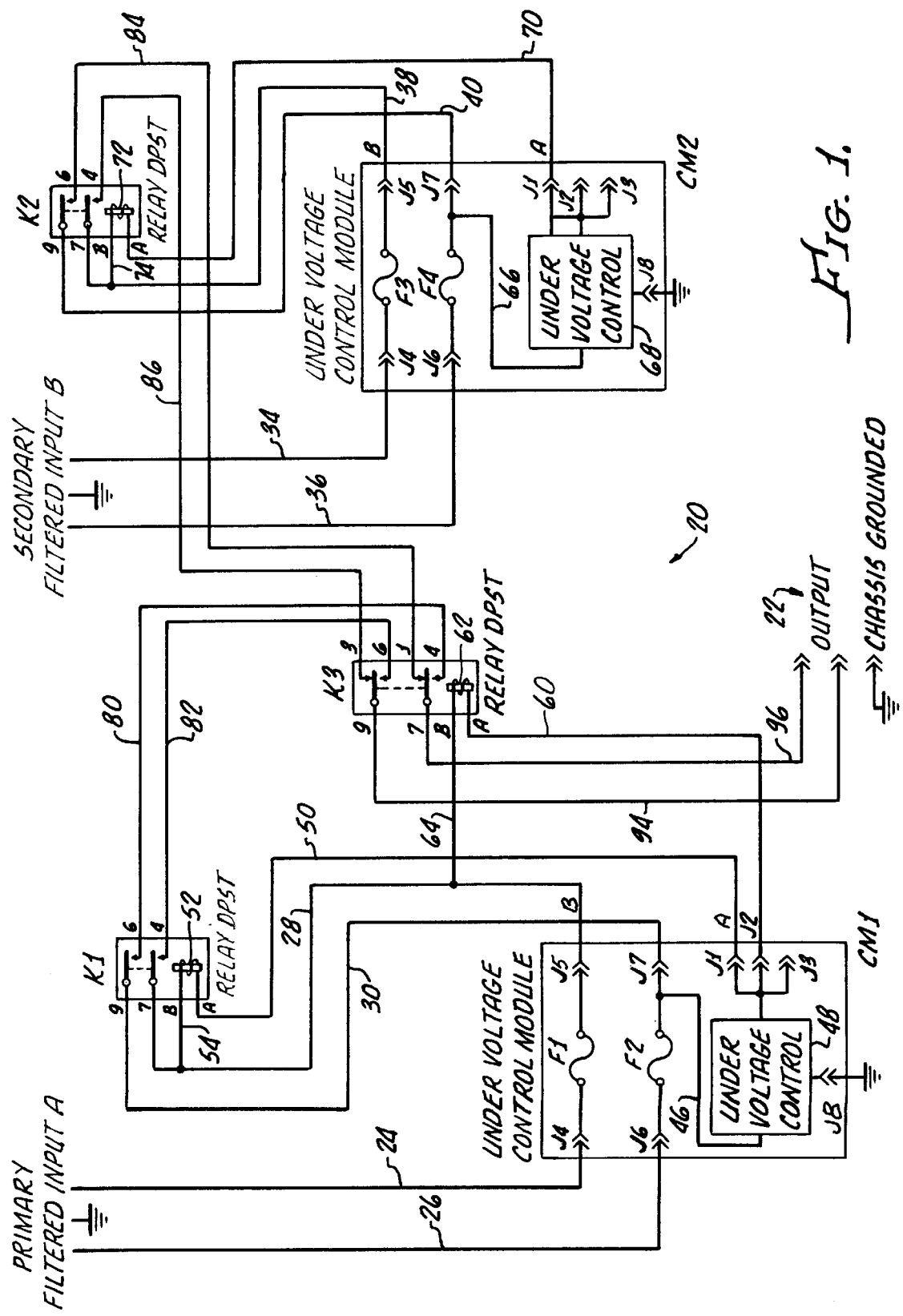
FIG. 1 is a functional block diagram of the dual-input, auto-switching power supply system of the present invention depicting the interconnection of primary and secondary power source inputs (A and B), a power output, three relays (K1, K2 and K3) and two under voltage control modules (CM1 and CM2)

In FIG. 1 there is depicted, in functional block diagram form, a dual input, auto-switching power supply 20 in accordance with a preferred embodiment of the present invention. Shown generally comprising power supply 20 are a primary filtered power input A, a secondary filtered power input B, a power output 22, respective first, second and third mechanical relays K1, K2 and K3, and respective first and second under voltage control modules CM1 and CM2.

For purposes of the following description, voltage is presumed to be provided from two independent external sources (not shown) to respective primary and secondary power inputs A and B.

As shown in FIG. 1, voltage is conducted from primary power input A, over electrical conduits 24 and 26, to input pins J4 and J6 of respective fuses F1 and F2 in first under voltage control module CM1. From output pins J5 and J7 of respective fuses F1 and F2, the voltage from primary power input A is conducted, over respective electrical conduits 28 and 30, to respective input pins 7 and 9 of normally-open, DPST (double pole, single throw) first relay KI. Thus, unless fuses F1 and/or F2 are blown, primary power input A is always connected to input pins 7 and 9 of first relay K1.

Voltage is similarly conducted from secondary power input B, over electrical conduits 34 and 36, to input pins J4 and J6 of respective fuses F3 and F4 in second under voltage control module CM2. From output pins J5 and J7 of respective fuses F3 and F4, the voltage from secondary power input B is conducted, over respective electrical conduits 38 and 30, to respective input pins 7 and 9 of normally-open, DPST second relay K2. Thus, unless fuses F3 and/or F4 are blown, secondary power input B is always connected to input pins 7 and 9 of second relay K2.

Within first under voltage control module CM1, voltage from primary power input A is conducted from downstream of fuse F1, over conduit 46, to an under voltage control circuit 48. From output pin 11 of under voltage control circuit 48 relay coil operating voltage is supplied, over conduit 50, to side A of K1 relay coil 52. Side B of K1 relay coil 52 is connected to conduit 28 by a conduit 54. From output pin 12 of under voltage control circuit 48 relay coil operating voltage is supplied, over conduit 60, to side A of K3 relay coil 62. Side B of K3 relay coil 62 is connected to conduit 28 by a conduit 64.

Within second under voltage control module CM2, voltage from secondary power input B is conducted from downstream of fuse F3, over conduit 66, to an under-voltage control circuit 68. From output pin 11 of under-voltage control circuit 68 relay coil operating voltage is supplied, over conduit 70, to side A of K2 relay coil 72. Side B of K2 relay coil 72 is connected to conduit 38 by a conduit 74.

As further shown, an output pin 6 of first relay K1 is electrically connected, by a conduit 80, to input pin 4 of third relay K3 and an output pin 4 of first relay K1 is electrically connected, by a conduit 82, to input pin 6 of third relay K3.

Similarly, an output pin 6 of second relay K2 is electrically connected, by a conduit 84, to input pin 1 of third relay K3 and an output pin 4 of second relay K2 is electrically connected, by a conduit 86, to input pin 3 of third relay K3.

Output pin 9 of third relay K3 is electrically connected, by a conduit 94, to power output 22 and output pin 7 of third relay K3 is electrically connected, by a conduit 66, to the power output.

From the foregoing, and as more particularly described below, it is apparent that under voltage control module CM1, associated with primary power input A, controls the operation of both first and third relays K1 and K3. Under voltage control module CM2, associated with secondary power input B, only controls the operation of second relay K2. It is also apparent that first and third relays K1 and K3 operate in electrical series as do second and third relays K2 and K3. Moreover, first and second relays K1 and K2 are separated by third relay K3.

This series, parallel arrangement of relays K1, K2 and K3 importantly provides a minimum moving contact gap spacing, source to source, of three millimeters as required by EN 60950, even though the moving contact gap spacing on each individual relay K1, K2 and K3 is less than three millimeters.

Further, when first under voltage control module CM1 energizes both first and third relay coils 52 and 62, the primary power input A is connected to power output 22. In this regard, primary power input A may be considered as the "default" input.

However, as more particularly described below, such energizing of relay coils 52 and 62 is dependent upon the internal level of voltage from primary power input A. If this level of voltage drops below a preestablished primary voltage dropout level, relay coils 52 and 62 are de-energized (i.e., no longer remain energized) by first under voltage control module CM1 and second power input B is automatically switched to power output 22. As a result of the below-disclosed circuitry developed by the present inventors, this primary-to-secondary power input switching is performed in less than about 15 milliseconds, and typically in only about 13.6 milliseconds, even when using mechanical relays K1, K2 and K3.

Conversely, if the internal level of voltage from primary power input A subsequently rises to a preestablished pull-in level (described below) that is greater than the preestablished primary voltage dropout level, relay coils 52 and 62 are re-energized by first under-voltage control module CM1 and secondary power input B is automatically disconnected from power output 22 and primary power input A is automatically reconnected to power output 22. This secondary-to-primary power input switching back is performed in less than about 15 milliseconds and typically in not more than about 13.6 milliseconds.

Figure 2:
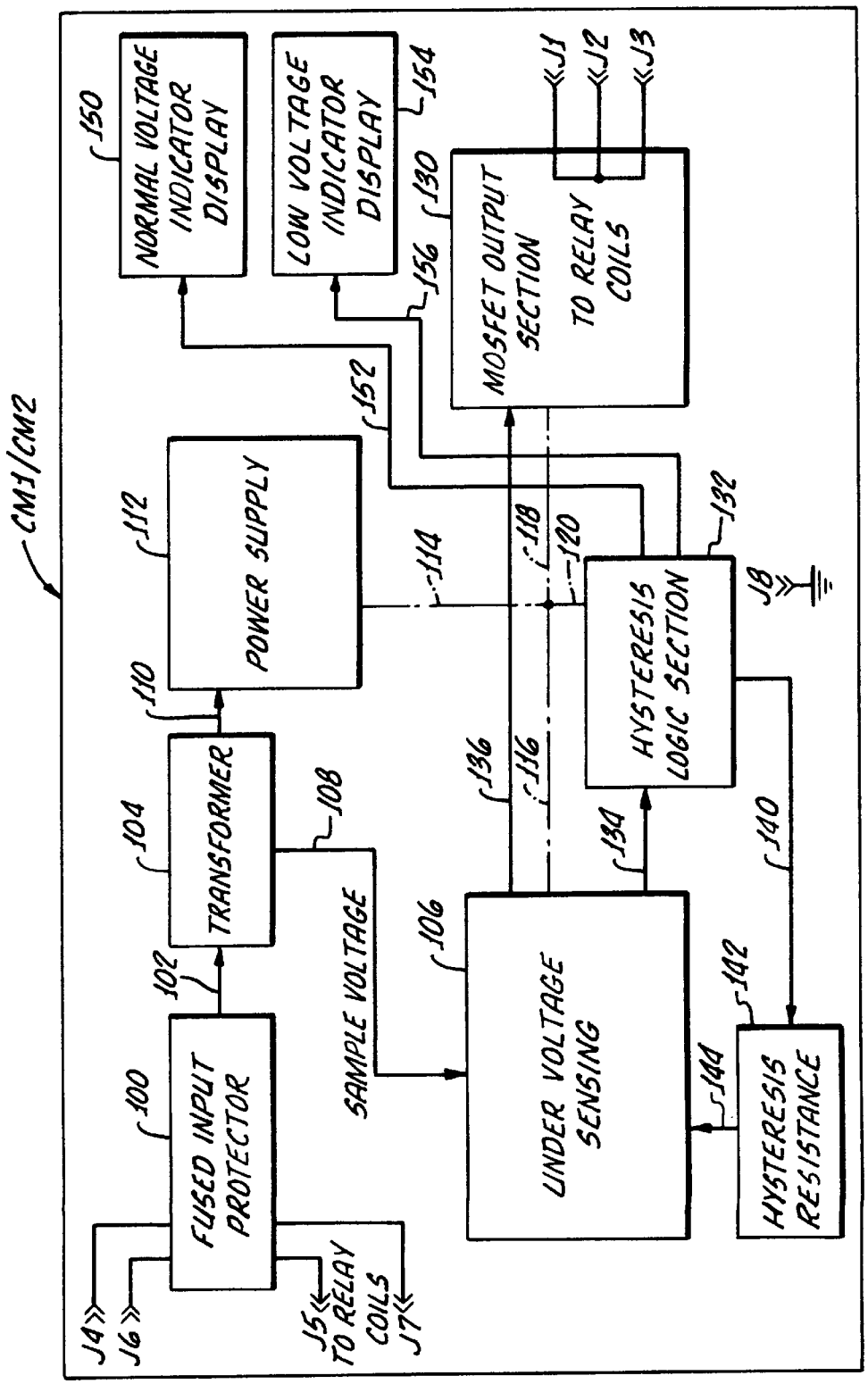
FIG. 2 is a functional block diagram of the under-voltage control modules of FIG. 1 depicting the major functional blocks thereof, including an internal power supply, an under voltage sensor, a hysteresis resistance, a hysteresis logic section and a MOSFET (metal oxide silicon field effect transistor) output section.

FIG. 2 depicts in functional block diagram form, the architecture which applies to both under voltage control modules CM1 and CM2. The under voltage control modules CM1 and CM2 are shown to include a fused input protection module 100 which contains fuses F1 and F2 (for CM1) or fuses F3 and F4 (for CM2) (FIG. 1). An output of mused input protection module 100 is connected by an electrical conduit 102 to a transformer 104 which provides a sample voltage to an under voltage sensing module 106 over an electrical conduit 108. Transformer 104 also provides a voltage, over an electrical conduit 110 to an internal power supply 112. As indicated by broken lines 114, 116, 118 and 120, power supply 112 provides a 5 VDC internal operating voltage to under voltage sensing module 106, a MOSFET output section 130 and a hysteresis logic section 132.

An output of under voltage sensing module 106 is fed, over an electrical conduit 134 to hysteresis logic section 132. A second output of under voltage sensing module 106 is fed, over an electrical conduit 136 to MOSFET output section 130.

An output of hysteresis logic section 132 is provided, over an electrical conduit 140, to a hysteresis resistance 142 which, in turn, provides an output to under voltage sensing module 106 over an electrical conduit 144. Hysteresis logic section 120 and hysteresis resistance establish a voltage pull-in level that is about eight percent greater than the voltage dropout level.

A normal voltage indicator display 150 receives an input from hysteresis logic section 132 over an electrical conduit 152. In a similar manner, a low voltage indicator display 154 receives an input from hysteresis logic section 132 over an electrical conduit 156.

The functional blocks and functional block arrangement depicted in FIG. 2 can be implemented in different ways. It is, however, preferred by the present inventors that the implementation be in accordance with the electrical schematic drawing depicted in FIG. 3.

Figure 3:
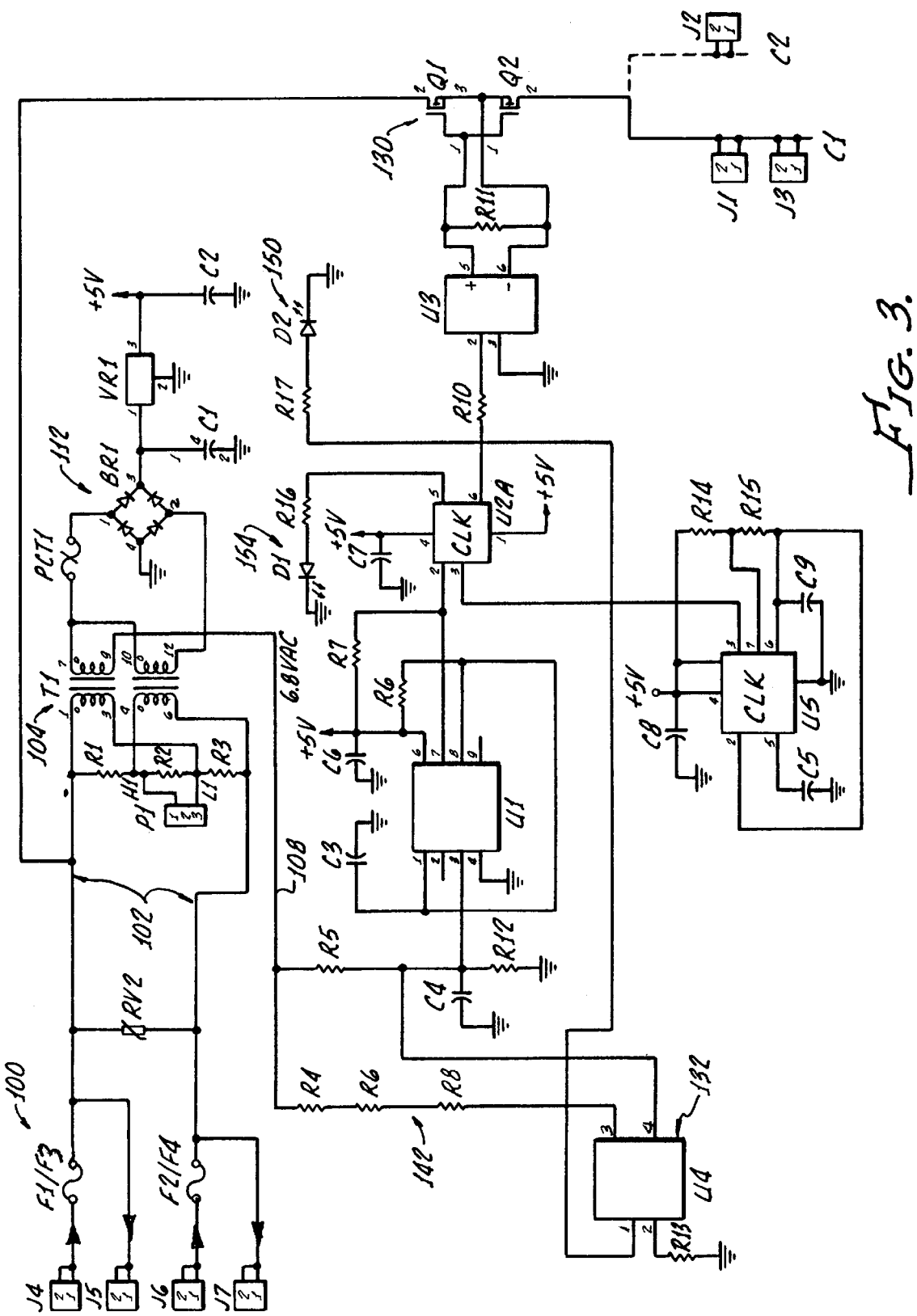
FIG. 3 is an electrical schematic drawing illustrating a preferred manner of implementing the dual-input, auto-switching power supply system of FIG. 1.

Although various functional blocks are depicted in FIG. 2 for ease of understanding the present invention, it will be appreciated that these functional blocks may not be readily recognizable in the actual circuit implementation of FIG. 3 because of efficient circuit design considerations. For a better understanding of the circuit schematic of FIG. 3, the electrical components and their values are listed in the following TABLE I. The pin numbers of the various electrical components are shown on the schematic drawing of FIG. 3.

TABLE I

DUAL-INPUT, AUTO-SWITCHING POWER
SUPPLY COMPONENT IDENTIFICATION

| | |
|---|---|
| K1 = Relay, DPST, SCHRACK RM5 Series | |
| K2 = Relay, DPST, SCHRACK RM5 Series | |
| K3 = Relay, DPDT, SCHRACK RM2 Series | |
| R1 = 0 Ω Resister Jumper* | R9 = 0 Ω |
| R2 = 0 Ω Resistor Jumper** | R10 = 220 Ω |
| R3 = 0 Ω Resister Jumper* | R11 = 10 MΩ |
| R4 = 2.2 MΩ | R12 = 100 KΩ |
| R5 = 1 MΩ | R13 = 220 Ω |
| R6 = 2.2 MΩ | R14 = 1 KΩ |
| R7 = 1 MΩ | R15 = 1 MΩ |
| R8 = 22 KΩ | R16 = 220 Ω |
| | R17 = 220 Ω |

*used only for 120 V power supply
**used only for a 240 V power supply
All resistors are ¼ watt

| | |
|---|---|
| C1 = 35 V, 1000 μF | C6 = 25 V, .1 μF |
| C2 = 25 V, 10 μF | C7 = 25 V, .1 μF |
| C3 = 25 V, 10 μF | C8 = 25 V, .1 μF |
| C4 = 50 V, 470 pF | C9 = 25 V, .1 μF |
| C5 = 25 V, .01 μF | |

D1 = Amber LED (low voltage indicator)
D2 = Green LED (normal voltage indicator
Q1 = N-channel power MOSFET, 4.3 A 1000 V, TO220
Q2 = N-channel power MOSFET, 4.3 A 1000 V, TO220
F1 = Fuse, 250 V, 20 A
F2 = Fuse, 250 V, 20 A
U1 = Over/Under voltage Detector, ICL7665SCPA
U2 = D-Type Flip Flop Preset and Clear, 74HTC74
U3 = Photovoltaic Optoisolator, PV15050-ND
U4 = Optoisolator, Solid State Switch, PS2501-NEC
U5 = CMOS Timer (5 Hz clock), NE5559
RV2 = Varistor, Metal Oxide, 150 V for 120 V Sys.
275 V FOR 220 V Sys.
T1 = Transformer, 120/240 V, 10/20 V, 10 VA
PCT1 = Fuse-Thermal-Resettable TABLE I-continued

DUAL-INPUT, AUTO-SWITCHING POWER
SUPPLY COMPONENT IDENTIFICATION

VR1 = Voltage Regulator, 5 V, 1 A, TO220
BR1 = Diode Rectifier Bridge,

It is also considered helpful to the understanding of FIG. 3 to provide a list of significant component pin designations, which are shown in following TABLE II.

TABLE II

PIN DESIGNATIONS

| | |
|---|---|
| U1 | Pin 1 "out 1" |
| | Pin 2 "set 1" |
| | Pin 6 "V+" |
| | Pin 7 "out 2" |
| | Pin 6 "set 2" |
| U2A | Pin 6 "QNOT" |
| U4 | Pin 1 "An" |
| | Pin 2 "Cath" |
| | Pin 3 "out/in" |
| | Pin 4 "in/out" |

The circuit schematic shown in FIG. 3 is equally applicable to both under voltage control modules CM1 and CM2 except for the output of MODFET transistors Q1 and Q2, As shown, transistors Q1 and Q2 control relays K1 and K3 for CM1 and relay K2 for CM2. Also, the schematic drawing is applicable for both 240 V and 120 V power supplies, except for 240 V, resistors R1 and R3 are zero ohm shunts and resistor R2 is omitted for a 120 V system and resistors R1 and R3 are omitted for a 240 V system.

Under voltage control module CM1 receives its power from primary input A and under voltage control module CM2 receives its power from secondary input B. Regulated 5 VDC operating voltage is internally provided by transformer T1 and components BR1, CI, VR1 and C2. Clock U2 provides the clock for flip-flop U2A at 5 Hz.

In the operation of under voltage control module CM1, in accordance with the schematic drawing of FIG. 3, the AC RMS voltage (approximately 6.8 VAC) from pin 12 of transformer T1 is sampled continuously at pin 3 of circuit U1 via the voltage divider formed of resistors R5 and R12. As long as the sampled voltage remains above a dropout voltage set by the voltage divider pin 7 of circuit U1 goes "Low" which is fed to pin 2 of flip-flop circuit U2A. This causes pin 6 (QNOT) of circuit U2A to clock out a "High" to pin 2 of photovoltaic optoisolator U3 which cause MOSFETs Q1 and Q2 to turn on, thereby energizing relays K1 and K3 and routing power from primary input A to power output 22 (not shown in FIG. 3).

If the sampled voltage at pin 3 of circuit U1 falls below the dropout voltage set by the voltage divider (resistors R5 and R12), pin 7 of circuit U1 goes "High" which is fed to pin 2 of flip-flop circuit U2A. This causes pin 6 (QNOT) of circuit U2A to clock out a "Low" to pin 2 of photovoltaic optoisolator U3 which causes MOSFETs Q1 and Q2 to turn off, thereby de-energizing relays K1 and K3. This causes the routing of power from secondary input B, through relays K2 and K3 to power output 22.

When QNOT pin of circuit U2A goes "low," optoisolator circuit U4 is turned on, placing resistors R4, R6 and R9 in parallel with resistor R5, thereby giving a hysteresis to establish a pull-in voltage level that is about eight percent above the dropout voltage level. For the resistor values shown in TABLE II above, the dropout voltage level under full load is about 185 VAC and the pull-in voltage level is about 200 VAC for a 240 V system (about 92.5 VAC and 100 VAC FOR A 120 V system).

Assuming that after falling to or below the dropout voltage, as described above, the voltage sampled at pin 3 (U5) rises to the drop in voltage established by hysteresis resistors R4, R6 and R9, pin 7 of U1 goes "Low" and QNOT pin 6 of U2A clocks out a "High" to circuit U3, thereby turning on MOSFETs Q1 and Q2 to re-energize relays K1 and K3. This disconnects secondary input B power from power output 22 and reconnects primary input A power to the power output.

Operation of under voltage control module CM2 is the same as described above for module CM1 except that MOSFETs Q1 and Q2 control operation of second relay K2. If after secondary input B power has been connected, through relays K2 and K3, to power output 22 (due to primary input A voltage falling below module CM1 dropout voltage), voltage from secondary power input B drops below the module CM2 dropout voltage, second relay K2 will be de-energized. As a consequence, power from neither primary input A or secondary input B will be will be applied to power output 22.

As above-described, under voltage control modules CM1 and CM2 incorporate MOSFET outputs having nanosecond switching times in comparison with heretofore known methods using SCR or TRIAC outputs which would add at least about eight milliseconds to the switching times. Moreover, using a latch and clock to add a set of hysteresis resistors (R4, R6 and R9) in under voltage control modules CM1 and CM2 provides rock solid dropout and pull-in voltage points. Consequently, any noise introduced into the system will not affect the low-voltage dropout and pull-in trip points.

Although there has been described above a dual-input, auto-switching power supply for purposes of illustrating the present invention, it is to be appreciated that the invention is not limited thereto. Consequently, any and all variations and/or equivalent arrangements which may occur to those skilled in the applicable art are to be considered to be within the scope and spirit of the invention as set forth in the claims which are appended hereto as part of this application.

What is claimed is:

1. A dual-input, automatic-switching power supply which comprises:

a. a primary power input, a secondary power input, and a power output;

b. first, second and third mechanical relays, an input pin of said first relay being electrically connected to said primary power input and a corresponding output pin of said first relay being electrically connected to a first input pin of said third relay, an input pin of said second relay being electrically connected to said secondary power input and a corresponding output pin of said second relay being electrically connected to a second input pin of said third relay, output pins of said third relay being electrically connected to said power output;

c. first control means connected for maintaining said first and third relays in states causing said primary power input to be electrically connected to said power output as long as voltage applied to said primary power input remains above a preestablished primary voltage dropout level;

d. second control means connected for maintaining said second relay in a state causing said secondary power input to be electrically connected to said second input pin of said third relay as long as voltage applied to said secondary power input remains above a preestablished secondary voltage dropout level; and e. switching means for automatically switching the third relay to a state causing said primary power input to be electrically disconnected from said power output and causing said secondary power input to be electrically connected to said power output when voltage from said primary power input drops below said preestablished primary voltage dropout level, the time required for said switching being no more than about 15 milliseconds.

2. The dual-input, automatic switching power supply as claimed in claim 1, wherein said switching means are operative for switching the third relay to a state causing said secondary power input to be electrically disconnected from said power output and causing said primary power input to be electrically reconnected to said power output when voltage applied to said primary power input rises to a preestablished primary input voltage pull-in level that is greater than said preestablished primary voltage dropout level, the time required for said switching back being less than about 15 milliseconds.

3. The dual-input, automatic switching power supply as claimed in claim 2, including hysteresis means for establishing said primary input voltage pull-in level.

4. The dual-input, automatic switching power supply as claimed in claim 2, wherein said pull-in voltage is about eight percent greater than said drop out voltage.

5. The dual-input, automatic switching power supply as claimed in claim 1, wherein said relays provide, in combination, at least a three millimeter relay moving contact gap, source to source.

6. The dual-input, automatic switching power supply as claimed in claim 1, wherein said first and second relays are normally open, double pole, single throw relays.

7. The dual-input, automatic switching power supply as claimed in claim 1, wherein said third relay is a double pole, double throw relay.

8. The dual-input, automatic switching power supply system as claimed in claim 1, wherein said switching means include a flip-flop circuit connected for changing the operating state of said first and third relays.

9. A dual-input, automatic-switching power supply which comprises:

a. a primary power input, a secondary power input, and a power output;

b. first, second and third mechanical relays, an input pin of said first relay being electrically connected to said primary power input and a corresponding output pin of said first relay being electrically connected to a first input pin of said third relay, an input pin of said second relay being electrically connected to said secondary power input and a corresponding output pin of said second relay being electrically connected to a second input pin of said third relay, output pins of said third relay being electrically connected to said power output, said relays in combination providing a relay moving contact gap spacing, source to source, of at least three millimeters;

c. first control means connected for maintaining said first and third relays in states causing said primary power input to be connected to said power output as long as voltage from said primary power input remains above a preestablished primary voltage dropout level;

d. second control means connected for maintaining said second relay in a state causing said secondary power input to be connected to said second input pin of said third relay as long as voltage from said secondary power input remains above a preestablished secondary voltage dropout level; and e. switching means for automatically switching the third relay to a state causing said primary power input to be disconnected from said power output and causing said secondary power input to be connected to said power output when the voltage from the primary power input drops below said preestablished primary voltage dropout level, the time required for said switching being performed in less than about 15 milliseconds.

10. The dual-input, automatic switching power supply as claimed in claim 9, wherein said switching means include hysteresis means for causing switching of the third relay to a state disconnecting said secondary power input from said power output and reconnecting said primary power input to the power output when the voltage from the primary power input rises to a preestablished primary voltage pull-in level that is about greater than said preestablished primary voltage dropout level, the time required for said switching back being less than about 15 milliseconds.

11. The dual-input, automatic switching power supply as claimed in claim 10, wherein said primary pull-in voltage is at least about eight percent greater than said primary drop out voltage.

12. The dual-input, automatic switching power supply as claimed in claim 9, wherein said first and second relays are normally open, double pole, single throw relays and said third relay is a double pole, double throw relay.

13. The dual-input, automatic switching power supply system as claimed in claim 9, wherein said switching means include a flip-flop circuit connected for changing the operating state of said first and third relays.

14. A dual-input, automatic-switching power supply which comprises:

a. a primary power input, a secondary power input, and a power output;

b. first, second and third mechanical relays, an input pin of said first relay being electrically connected to said primary power input and a corresponding output pin of said first relay being electrically connected to a first input pin of said third relay, an input pin of said second relay being electrically connected to said secondary power input and a corresponding output pin of said second relay being electrically connected to a second input pin of said third relay, output pins of said third relay being electrically connected to said power output, said relays in combination providing a relay moving contact gap spacing, source to source, of at least three millimeters;

c. first control means connected for maintaining said first and third relays in states causing said primary power input to be connected to said power output as long as voltage from said primary power input remains above a preestablished primary voltage dropout level;

d. second control means connected for maintaining said second relay in a state causing said secondary power input to be connected to said second input pin of said third relay as long as voltage from said secondary power input remains above a preestablished secondary voltage dropout level;

e. switching means for automatically switching the third relay to a state causing said primary power input to be disconnected from said power output and causing said secondary power input to be connected to said power output when the voltage from the primary power input drops below said preestablished primary voltage dropout level, the time required for said switching being performed in less than about 15 milliseconds, said switching means including a flip-flop circuit connected for changing the operating state of said first and third relays; and f. hysteresis means for causing switching of the third relay to a state disconnecting said secondary power input from said power output and reconnecting said primary power input to the power output when the voltage from the primary power input rises to a preestablished primary voltage pull-in level that is about greater than said preestablished primary voltage dropout level, the time required for said switching back being less than about 15 milliseconds.

15. The dual-input, automatic switching power supply as claimed in claim 14, wherein said primary pull-in voltage is at least about eight percent greater than said primary drop out voltage.

16. The dual-input, automatic switching power supply as claimed in claim 14, wherein said first and second relays are normally open, double pole, single throw relays and said third relay is a double pole, double throw relay.

* * * * *